United States Patent
Kozisek et al.

[11] Patent Number: 6,049,246
[45] Date of Patent: Apr. 11, 2000

[54] AMPLIFIER OFFSET CANCELLATION USING CURRENT COPIER

[75] Inventors: James R. Kozisek, Chandler; Thomas W. Ciccone, Tempe, both of Ariz.

[73] Assignee: Vivid Semiconductor, Inc., Chandler, Ariz.

[21] Appl. No.: 09/210,494

[22] Filed: Dec. 11, 1998

[51] Int. Cl.$^7$ .................................................... H03F 1/02
[52] U.S. Cl. ............................... 330/9; 330/253; 330/257
[58] Field of Search ................................. 330/9, 253, 257

[56] References Cited

U.S. PATENT DOCUMENTS

| | | | |
|---|---|---|---|
| 3,694,760 | 9/1972 | Loessi | 330/9 |
| 3,748,587 | 7/1973 | Aumiaux | 330/9 |
| 3,810,031 | 5/1974 | Poujois | 330/9 |
| 3,988,689 | 10/1976 | Ochi et al. | 330/9 |
| 4,068,182 | 1/1978 | Dingwall et al. | 330/9 |
| 4,152,659 | 5/1979 | Gordon | 330/9 |
| 4,306,196 | 12/1981 | Dwarakanath et al. | 330/9 |
| 4,417,160 | 11/1983 | Schade, Jr. | 307/353 |
| 4,491,800 | 1/1985 | Miyata | 330/51 |
| 4,555,668 | 11/1985 | Gregorian et al. | 330/9 |
| 4,697,152 | 9/1987 | Westwick | 330/9 |
| 5,483,194 | 1/1996 | Genest | 330/253 |
| 5,530,399 | 6/1996 | Chambers et al. | 327/561 |
| 5,604,464 | 2/1997 | Hwang et al. | 330/253 |

OTHER PUBLICATIONS

Degrauwe, et al. "A Micropower CMOS–Instrumentation Amplifier", *IEEE J. Solid–State Circuits,* Jun. 1985, vol. SC–20, No. 3, pp. 805–807.

Allen–Holberg, "CMOS Analog Circuit Design," Holt, Rinehart & Winston, 1987 pp. 357–360.

Franca–Tsividis, "Design of Analog–Digital VLSI Circuits for Telecommunications and Signal Processing"; Prentice Hall 1994 ($2^{nd}$ Edition) pp. 108–112.

Gregorain–Temes, "Analog MOS Integrated Circuits," John Wiley & Sons, 1986, p. 416.

*Primary Examiner*—Michael B Shingleton
*Attorney, Agent, or Firm*—Cahill, Sutton & Thomas

[57] ABSTRACT

A differential amplifier circuit achieves offset cancellation by supplying an offset correction current from a current copier circuit to the output of the differential amplifier. The current copier is programmed by closing a first switch to short the differential input terminals of the amplifier, by opening a second switch to break the feedback loop of the amplifier, and by closing a third switch to allow the current copier to sense the offset output voltage at the output of the amplifier. The current copier generates an equal and opposite offset cancellation current which is summed with the offset current from the amplifier. The current copier circuit includes a storage capacitor for storing a voltage required to produce such offset cancellation current. After programming the storage capacitor, the third switch is opened, the first switch is opened, and the second switch is closed for normal operation.

6 Claims, 4 Drawing Sheets

AMPLIFIER OFFSET CANCELLATION USING CURRENT COPIER

BACKGROUND OF THE INVENTION

1. Field of the Invention

The present invention relates generally to differential amplifiers of the type used to amplify a differential input voltage and provide an output voltage for driving a load, and more particularly, to an apparatus and method for canceling any offsets inherent in such differential amplifier.

2. Description of the Relevant Art

Differential amplifiers are widely used within the electronics industry for receiving a differential input signal and producing an amplified output voltage derived therefrom. Often, such differential amplifiers include a first, or positive, input terminal and a second, or negative, input terminal, along with a third output terminal. The differential input voltage is presented across the first and second input terminals, and the output voltage is a function of the difference between the absolute voltages presented at the positive and negative input terminals. Typically, a feedback path is provided from the output terminal back to the negative, or inverting, input terminal to establish the amount of amplification provided by the differential amplifier and to increase the stability thereof A perfect differential amplifier would provide a null, or mid-range, zeroed output voltage when the magnitude of the input differential voltage is zero. However, due to transistor mismatches, current source mismatches, current mirror errors, and other imperfections, there is usually an input voltage offset inherently present in most differential amplifiers when used in a feedback configuration. This offset error means that the differential input voltage signal must be non-zero (either slightly positive or slightly negative) in order for the output voltage to be brought to the null voltage. This offset error must be compensated if the output voltage is to maintain an accurate linear relationship with the differential input voltage signal.

In the past, the most common method of compensating for the aforementioned offset error is to determine the differential input voltage offset error, and to add or subtract such voltage offset error from one of the differential input terminals. For example, U.S. Pat. No. 4,306,196 to Dwarakanath et al. discloses such circuitry wherein a capacitor is precharged with the offset voltage and is disposed in series with the input signal path. One of the disadvantages of such an approach is the need to insert a capacitor within one of the input signal paths, thereby relying upon AC coupling of either the input signal or the feedback signal to the input terminal of the differential amplifier.

Some cancellation circuits require dual or multiple amplifier stages; obviously, such offset compensation circuits do not lend themselves to use within a single stage amplifier. Other cancellation circuits require the feedback loop of the differential amplifier to be closed when detecting the offset error; in such instances, significant stabilization time may be required during the offset detection mode while the feedback loop stabilizes.

Some known offset correction circuits require a virtual ground circuit in order to accomplish cancellation, i.e., one of the input terminals to the differential amplifier must be connected to a reference voltage. However, such circuits do not allow the common mode input to the amplifier to change after the offset error cancellation has been performed.

Offset cancellation circuits are known wherein the feedback loop is broken when deriving the offset correction voltage; U.S. Pat. No. 3,694,760 to Loessi is an example of such a circuit. Other cancellation circuits are known wherein offset correction is achieved by generating offset correcting currents, rather than offset correcting voltages; for example, in U.S. Pat. No. 3,988,689 to Ochi et al., differential drain currents are generated and directed back to the positive and negative input terminals of the differential amplifier to achieve offset error compensation. However, none of such offset cancellation circuits are believed to provide the advantages obtained by the present invention.

Accordingly, it is an object of the present invention to provide a simple and inexpensive differential amplifier circuit which effectively cancels offset error within the differential amplifier.

It is another object of the present invention to provide such a differential amplifier circuit wherein both the differential input signal and the feedback path signal may be directly coupled to the input terminals of the differential amplifier without the use of any AC coupling.

It is still another object of the present invention to provide such a differential amplifier circuit wherein the feedback loop settling time of the differential amplifier is not a factor when detecting the offset error.

A further object of the present invention is to provide such a differential amplifier wherein the common mode level of the differential input signal can change after the offset error has been detected without requiring any resetting of the cancellation offset circuitry.

A still further object of the present invention is to provide such a differential amplifier circuit which can be implemented with a relatively small number of transistors.

Yet another object of the present invention is to provide such a differential amplifier circuit that can achieve offset cancellation with a single-stage differential amplifier.

Still another object of the present invention is to provide a method for compensating the offset error of a differential amplifier which can be implemented without unduly complicating the differential amplifier or degrading its performance.

These and other objects of the invention will become more apparent to those skilled in the art as the description of the present invention proceeds.

SUMMARY OF THE INVENTION

Briefly described, and in accordance with a preferred embodiment thereof, the present invention provides a differential amplifier circuit incorporating offset cancellation, the differential amplifier including positive and negative input terminals for receiving an input differential signal, and including an output terminal for producing an output signal. The differential input signal is typically in the form of a differential input voltage, and the output signal may be viewed as an output current for driving a load, wherein the output current is derived from the input differential voltage.

Offset cancellation is accomplished with the aid of switching devices, including a first switch that selectively shorts together the positive and negative input terminals to null any input differential voltage thereacross. A second switch selectively couples the output terminal of the differential amplifier back to the negative input terminal to open or close the feedback loop of the differential amplifier; the second switch is closed for closed-loop operation, or selectively opened for open-loop operation. A third switch, to be described shortly, also plays a role in the offset compensation scheme.

A current copier circuit is also included as part of the offset cancellation circuitry and includes an input terminal for selectively receiving the output voltage at the output terminal of the differential amplifier. The current copier circuit also includes an output terminal coupled to the output terminal of the aforementioned differential amplifier for supplying, i.e., sourcing or sinking, an offset current having a magnitude based upon the voltage received by the input terminal of the current copier circuit. The third switch selectively couples the input terminal of the current copier circuit to the output terminal of the differential amplifier to "program" the current copier circuit. In response to the voltage present on the output terminal of the differential amplifier, the current copier circuit supplies a current equal and opposite to the offset current supplied to the output terminal by the differential amplifier. The current copier circuit also includes a storage device for storing the voltage received at the input terminal thereof The differential amplifier circuit and current copier circuit are controlled by a control circuit for selecting between a cancellation mode and an operating mode of the differential amplifier. During the cancellation mode, the control circuit causes the first switch to be closed, the second switch to be opened, and the third switch to be closed, for allowing the current copier circuit to sense any output offset current at the output terminal of the differential amplifier with a null differential input voltage during open-loop operation, and to supply an equal and opposite offset current to the output terminal of the differential amplifier. During the normal operation mode, the control circuit causes the first switch to be opened, the second switch to be closed, and the third switch to be opened, for allowing the differential amplifier to operate in closed loop feedback mode and to respond to the differential input voltage while continuing to supply the programmed amount of offset current to the output terminal of the differential amplifier, thereby canceling any output current offset inherent in the differential amplifier.

When switching from the cancellation mode to the normal operation mode, the control circuit opens the third switch before opening the first switch and before closing the second switch. This causes the input terminal of the current copier circuit to be decoupled from the output terminal of the differential amplifier, and allows the current copier circuit to sample and store the voltage required to produce the desired amount of offset compensation current, before returning to the normal operating mode of the differential amplifier. Preferably, the storage device within the current copier circuit is a storage capacitor coupled to the input terminal of the current copier circuit for sampling the voltage received thereby when said third switch is closed. The current copier circuit includes a current source that is coupled to the output terminal thereof, and which is controlled by the voltage sampled by the storage capacitor for supplying the desired offset compensation current.

Another aspect of the present invention is a method for canceling offset current inherent in such a differential amplifier. The method of the present invention includes the step of temporarily shorting together the positive and negative input terminals of the differential amplifier to null any input differential voltage thereacross. The method also includes the step of temporarily opening the feedback path of the differential amplifier for decoupling the output terminal of the differential amplifier from the negative input terminal thereof, allowing the differential amplifier to temporarily operate in an open-loop mode. The method further includes the step of sensing and recording any offset current at the output terminal of the differential amplifier, and providing an equal and opposite offset cancellation current thereto. Once the desired amount of offset cancellation current is determined, the sensing/recording step is terminated, while allowing the recorded offset cancellation current to be supplied to the output terminal of the differential amplifier to cancel any output current offset inherent in the differential amplifier. The differential amplifier is then returned to a normal mode of operation by discontinuing the shorting of the positive and negative input terminals of the differential amplifier, and by reconnecting the feedback path for allowing the differential amplifier to operate in a closed loop manner once again.

BRIEF DESCRIPTION OF THE DRAWINGS

FIG. 7 is a circuit schematic showing the application of the offset cancellation method to a two stage differential amplifier circuit.

DETAILED DESCRIPTION OF THE PREFERRED EMBODIMENT

Figure 1:
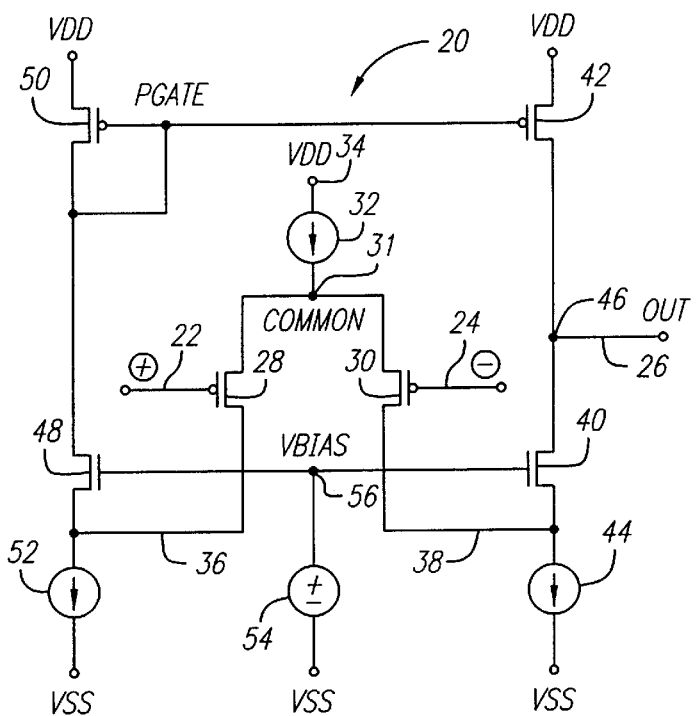
FIG. 1 is a circuit schematic of a typical differential amplifier circuit constructed from CMOS transistors, before the addition of the offset cancellation circuitry of the present invention.

The circuit schematic of FIG. 1 shows a typical CMOS folded cascode operational transconductance amplifier, or OTA, designated generally by reference numeral 20. OTA 20 is a form of a differential amplifier and includes a positive input terminal 22 and a negative input terminal 24 for receiving an input differential voltage. OTA 20 also includes an output terminal 26 for producing an output current and resulting output voltage for driving a load (not shown) connected thereto. The output signal produced at output terminal 26 is derived from the input differential voltage applied across input terminals 22 and 24.

Differential transistors 28 and 30, both shown as p-channel devices, share a common node 3 1 and receive a current from current source 32 coupled between common node 31 and positive power supply voltage VDD 34. Ideally, when the voltages at input terminals 22 and 24 are equal, the current supplied by current source 32 is divided equally between transistors 28 and 30, half flowing through conductor 36 and half flowing through conductor 38. OTA 20 includes a pair of output legs, the first output leg including n-channel transistor 40, p-channel transistor 42, and current source 44. Output terminal 26 is provided at the common node 46 between transistors 40 and 42. The second output leg includes n-channel transistor 48, p-channel transistor 50, and current source 52. Bias voltage circuit 54 applies a biasing voltage to node 56 to maintain transistors 40 and 48 in operation. Current sources 44 and 52 sink equal currents, and the sum of the currents conducted by current sources 44 and 52 is greater than the amount of current sourced by current source 32. Transistors 50 and 42 are configured as a current mirror, with transistor 42 mirroring the current flowing through transistor 50.

When the circuit of FIG. 1 is in balance, the currents flowing through the two output legs are in balance; all of the current sourced by p-channel transistor 42 is sunk by transistor 40, and the current available to flow out of output terminal 26 is zero. Any differential voltage placed across input terminals 22 and 24 will steer a controlled amount of current through output terminal 26. For relatively small differential voltages, OTA 20 behaves very much like a voltage-controlled current source, or transconductance device. Ideally, there is no output current flowing into or out of output terminal 26 when the differential input voltage applied across input terminals 22 and 24 is zero. However, mismatch between current sources 52/44, current mirror 50/42, and the differential pair 28/30 often contribute to a non-zero output offset current. This output offset current effectively results in an input offset voltage when OTA 20 is used in a feedback configuration.

This input offset voltage problem may be fundamentally viewed as an offset error in the output current. If one cancels the offset error in the output current, then the input offset voltage is eliminated. Thus, one may compensate for any input offset voltage of OTA 20 by first forcing a zero differential voltage across input terminals 22 and 24, measuring the output offset current produced by such condition at output terminal 26, and then subtracting a copy of such output offset current from the output of OTA 20. This is essentially the basis of the present invention, and is demonstrated conceptually in FIGS. 2 and 3.

Figure 2:
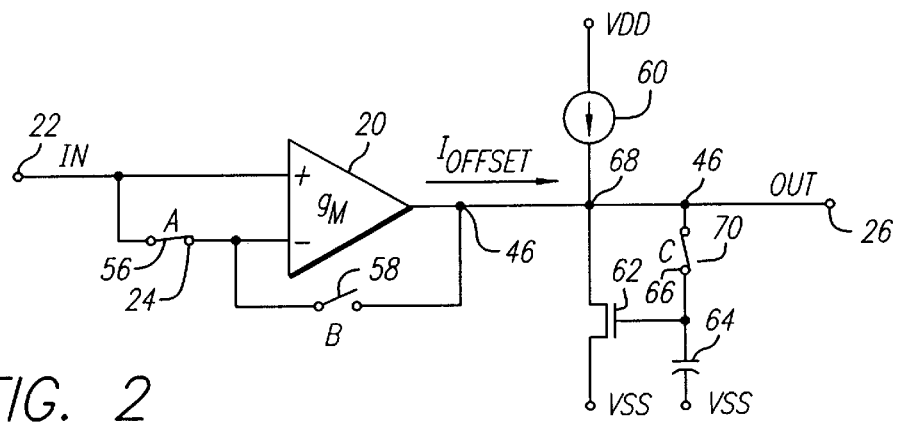
FIG. 2 is a conceptual schematic drawing showing the addition of three switches and a current copier circuit being programmed to supply an offset cancellation current to the output of the differential amplifier.
Figure 3:
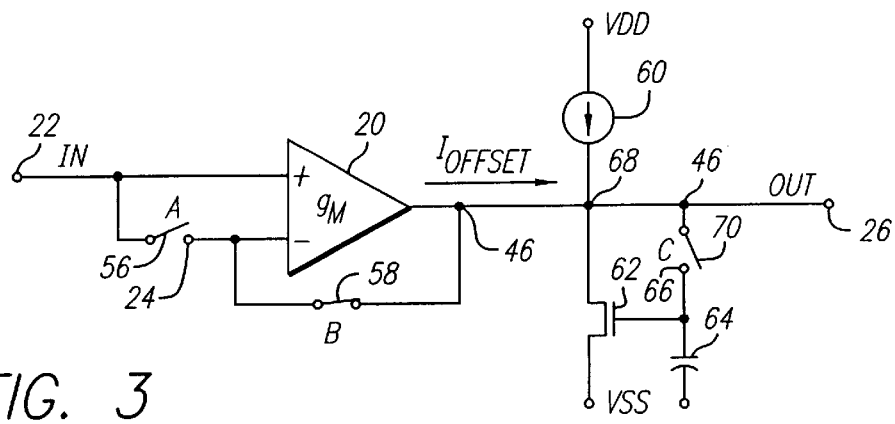
FIG. 3 is a conceptual schematic drawing similar to that of FIG. 2 but showing the normal mode of operation of the compensated differential amplifier.

Within FIGS. 2 and 3, OTA 20 is shown having input terminals 22 and 24 and output terminal 26 coupled to output node 46. A feedback path extends between output node 46 and negative input terminal 24. A first switch 56 extends between positive input terminal 22 and negative input terminal 24 for selectively shorting such input terminals together in order to null any input differential voltage thereacross. A second switch 58 is inserted within the aforementioned feedback path for selectively opening or closing the feedback path that couples output node 46 back to negative input terminal 24 of OTA 20. When switch 58 is closed, as shown in FIG. 3, OTA 20 operates in closed-loop fashion; when switch 58 is opened, as shown in FIG. 2, OTA 20 operates in open-loop fashion.

Still referring to FIGS. 2 and 3, a current copier circuit is conceptually represented by current source 60, transistor 62, and storage capacitor 64. The current copier circuit has a first terminal 66 for selectively allowing storage capacitor 64 to be connected to output node 46 of OTA 20. The current copier circuit also includes a second terminal 68 coupled to output node 46, and to output terminal 26, of OTA 20. The function of this current copier circuit is to "supply" an offset current having a magnitude that is equal and opposite to the output offset current of OTA 20. As used herein, the term "supply" could mean either sourcing current or sinking current. As shown in FIGS. 2 and 3, a third switch 70 is provided for selectively coupling first terminal 66 of the current copier circuit to output node 46 of OTA 20, thereby allowing the current copier circuit to respond to the voltage present on output node 46.

Current source 60 sources a fixed amount of current. Transistor 62 can be biased to sink an amount of current that is either greater than, equal to, or less than, the amount of current sourced by current source 60. If the output offset current were zero, then transistor 62 would sink exactly the amount of current sourced by current source 60. The voltage at first terminal 66 of the current copier circuit is charged across storage capacitor 64. This voltage controls the bias across transistor 62, and hence determines the degree to which transistor 62 conducts current. Thus, the current supplied by the current copier circuit is based upon the voltage at first terminal 66 thereof After switch 70 is opened, capacitor 64 stores the last voltage value present at first terminal 66; in this manner, transistor 62 continues to sink a desired amount of current after switch 70 is opened.

FIG. 2 demonstrates the first phase of the offset current cancellation scheme. In this phase, also known as the cancellation mode, first switch 56 is closed to null the differential input voltage, second switch 58 is opened to disconnect the feedback loop, and third switch 70 is closed for allowing the current copier circuit to sense, and null out, any output current offset at output node 46. The voltage at node 46, and hence the voltage at first terminal 66, will drift until transistor 62 is biased in such a manner that the net current supplied to second terminal 68 of the current copier circuit (i.e., the net difference between the amount of current sourced by current source 60 and sunk by transistor 62) exactly balances any output offset current provided by output node 46 of OTA 20. In this manner, the current copier circuit supplies an equal and opposite offset compensation current to output node 46 of OTA 20. This cancellation mode of operation can be performed relatively quickly because the settling time of OTA 20 is not a factor, since the feedback loop of OTA 20 has been broken temporarily. The current copier needs to be in this cancellation mode, or programming mode, only long enough for the currents in the circuit to stabilize.

Once the cancellation or programming mode of FIG. 2 is performed, the circuitry is switched to the normal mode of operation shown in FIG. 3. First, third switch 70 is opened, causing capacitor 64 to maintain the voltage needed to create the offset cancellation current. Next, first switch 56 is opened and second switch 58 is closed. Opening first switch 56 terminates the shorting together of differential input terminals 22 and 24, allowing such input terminals to respond normally to the differential input voltage presented thereacross. Closing second switch 58 reconnects the feedback loop for operating OTA 20 in closed-loop fashion. Meanwhile, the voltage programmed on storage capacitor 64 causes transistor 62 to continue to draw the desired amount of current such that the current copier circuit supplies the desired offset cancellation current to output node 46 of OTA 20 to cancel the output offset current inherent therein.

Figure 4:
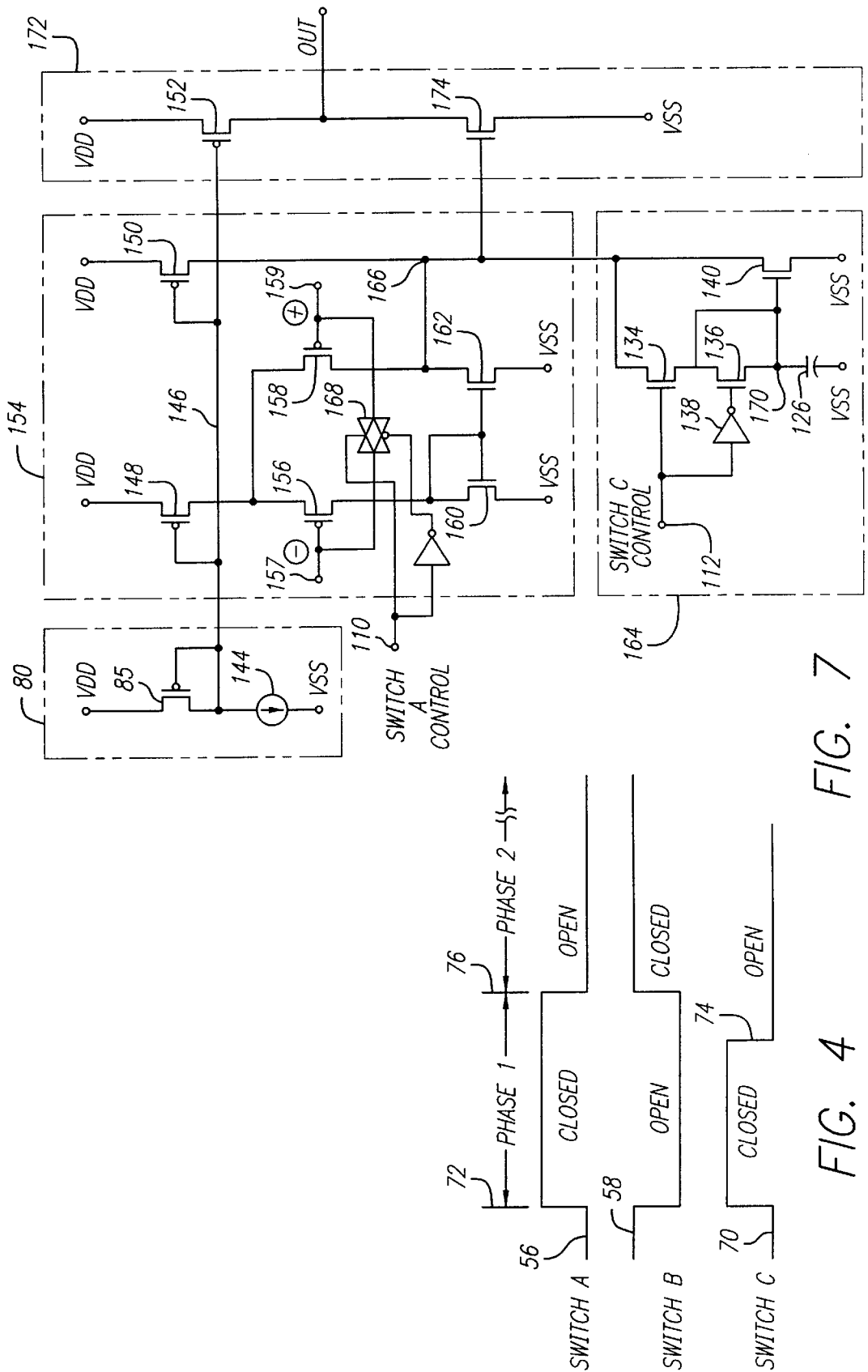
FIG. 4 is a timing waveform showing control signals in the form of clock waveforms generated by a control circuit in order to properly sequence the opening and closing of the three switches shown in FIGS. 2 and 3.

FIG. 4 shows a series of timing waveforms used to control first switch 56 (Switch A), second switch 58 (Switch B), and third switch 70 (Switch C) of FIGS. 2 and 3. As shown in FIG. 4, a first phase (Phase 1) begins at the time designated by reference numeral 72. At the beginning of Phase 1, switch 56 (Switch A) is closed to temporarily short the positive and negative input terminals of OTA 20 to null any input differential voltage thereacross. At the same time, switch 58 (Switch B) is temporarily opened to break the feedback path of OTA 20 by decoupling output node 46 of OTA 20 from the negative input terminal thereof, thereby causing open-loop operation. Likewise, at the beginning of the first phase, switch 70 (Switch C) is closed for allowing the current copier circuit to sense, via first terminal 66, any offset current at output node 46 and to provide an equal and opposite offset cancellation current to second terminal 68.

Still referring to FIG. 4, prior to the end of the first phase, namely, at the point in time designated by reference numeral 74, switch 70 (Switch C) is opened again, thereby terminating the sensing of the offset current, while recording the sensed offset current via the voltage stored on capacitor 64. Though switch 70 is opened, the current copier circuit continues to supply the recorded offset cancellation current to second terminal 68 to cancel any output current offset inherent in OTA 20.

The end of Phase 1, and the beginning of Phase 2, is designated in FIG. 4 by reference numeral 76. At this point in time, switch 56 (Switch A) is opened once again allow OTA 20 to respond to a differential voltage placed across the pointime, switch 58 (Swput terminals thereof Likewise, at this point in time, switch 58 (Switch B) is opened again to reconnect the feedback path for allowing OTA 20 to operate in the normal closed loop manner.

Unlike most offset cancellation techniques, the settling time of OTA 20 is not a factor in the speed of the cancellation, since OTA 20 operates in the open-loop mode (i.e., the feedback loop is broken) when the current copier circuit establishes the cancellation current. The amount of time required between the beginning of Phase I (point 72) and the time that switch 70 is opened again (point 74) is merely the time required for the currents in the circuit to stabilize. Another advantage of the present offset current cancellation technique is that the common mode input to the amplifier may change once offset current cancellation has taken place during Phase 1. In contrast, most other cancellation techniques require a virtual ground topology in which one of the amplifier inputs is always connected to a reference voltage.

Figure 5:
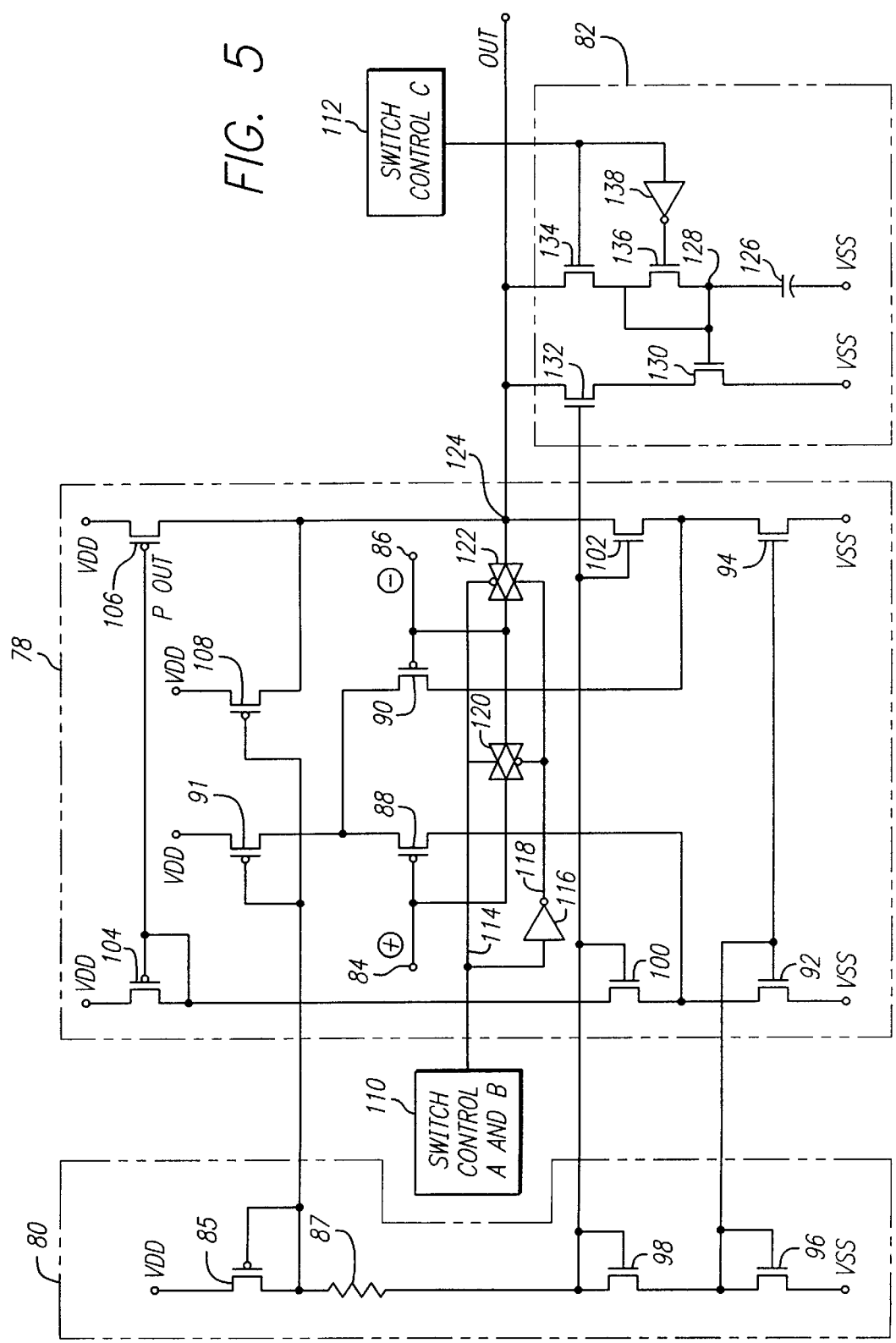
FIG. 5 is a circuit schematic showing the differential amplifier, current copier circuit, and a bias circuit for implementing the offset compensation scheme shown conceptually in FIGS. 2 and 3.

FIG. 5 illustrates a practical embodiment of an operational amplifier embodying the present invention. Within FIG. 5, an operational transconductance amplifier (OTA) is shown in dashed block 78; a bias circuit for OTA 78 is shown in dashed block 80, and the current copier circuit is shown in dashed block 82. OTA 78 includes positive and negative input terminals 84 and 86, respectively. Differential input p-channel transistors 88 and 90 collectively conduct a shared current supplied by current source transistor 91; this shared current supplied by transistor 91 is set by resistor 87 and bias transistor 85 in the bias circuit 80. Transistors 88 and 90 direct such shared current to the drain terminals of n-channel current source transistors 92 and 94, respectively. The current in current source transistors 92 and 94 is set by transistor 96 in bias circuit 80. Transistor 96 is in series with transistor 98 to form a cascode arrangement. Likewise, n-channel transistors 100 and 102 form cascode structures with current source transistors 92 and 94, respectively, for better matching of currents. P-channel transistors 104 and 106 form a current mirror, such that transistor 106 supplies the same current as transistor 104. P-channel transistor 108 supplies a forced error current to make up the difference, if any, between the current sourced by transistor 106 and the current sunk by transistor 102.

In order to incorporate the offset current cancellation technique of the present invention, the circuit of FIG. 5 includes two control circuit blocks 110 and 112. Control block 110 provides a first control signal to conductor 114 that essentially looks like the waveform shown in FIG. 4 for switch 56 (Switch A); inverter 116 provides the complement of the first control signal to conductor 118. During Phase 1, the first control signal provided to conductor 114 goes high, and the complemented control signal on conductor 118 goes low. A transmission gate 120 extends between positive input terminal 84 and negative input terminal 86 of OTA 78. Conductors 114 and 118 enable transmission gate 120 to be conductive during Phase 1 and disable transmission gate 120 during Phase 2. Thus, during Phase 1, positive input terminal 84 and negative input terminal 86 of OTA 78 are shorted together. Transmission gate 120 corresponds to switch 56 (Switch A).

Also shown in FIG. 5 is a second transmission gate 122 which has its enabling and disabling control terminals reversed in comparison with those of transmission gate 120. During Phase 1, conductors 114 and 118 cause transmission gate 122 to be disabled, breaking any feedback path between negative input terminal 86 and output node 124. In contrast, during Phase 2, transmission gate 122 is enabled, thereby creating a feedback path from output node 124 back to negative input terminal 86.

Current copier circuit 82 of FIG. 5 includes storage capacitor 126 which corresponds to storage capacitor 64 of FIGS. 2 and 3. Node 128 of storage capacitor 126 is coupled to the gate terminal of n-channel transistor 130. The drain terminal of transistor 130 is coupled by cascode-connected n-channel transistor 132 back to output node 124; thus, transistors 130 and 132 serve the function of transistor 62 in FIGS. 2 and 3. N-channel transistor 134 corresponds to switch 70, or Switch C, of FIGS. 2 and 3 for selectively coupling output node 124 to node 128 of storage capacitor 126. Switch Control C block 112 supplies a control signal corresponding to the signal labeled "Switch C" in FIG. 4. When the Switch C control signal goes high, transistor 134 is conductive, and node 124 is coupled to node 128 for controlling the voltage on storage capacitor 126. When the Switch C control signal goes low just before the end of Phase 1, transistor 134 is rendered non-conductive, and node 128 remains at the voltage charged across storage capacitor 126.

The description of switching transistor 134 set forth above ignores the inherent capacitance between the gate and source terminals of transistor 134. When the Switch C control signal switches from high to low, the gate-to-source capacitance of transistor 134 tends to want to pass such negative-going pulse onto the source terminal of transistor 134; this would interfere with the voltage already stored across capacitor 126. In order to cancel the effects of the gate-to-source capacitance of transistor 134, N-channel transistor 136 is added to the current copier circuit 82. N-channel transistor 136 is a "dummy" transistor, and the gate terminal thereof is driven by the complement of the Switch C control signal via inverter 138. N-channel transistor 136 is half the size of switching transistor 134, but both its source and drain terminals are coupled to node 128 of storage capacitor 126. Thus, the sum of the gate-to-source and gate-to-drain capacitances of dummy transistor 136 roughly equals the gate-to-source capacitance of switching transistor 134. Accordingly, any charge removed from node 128 by the gate-to-source capacitance of transistor 134 as the Switch C control signal falls is roughly balanced by the charge pumped in to node 128 by the gate-to-source and gate-to-drain capacitances of dummy transistor 136 as the complemented Switch C control signal rises.

Figure 6:
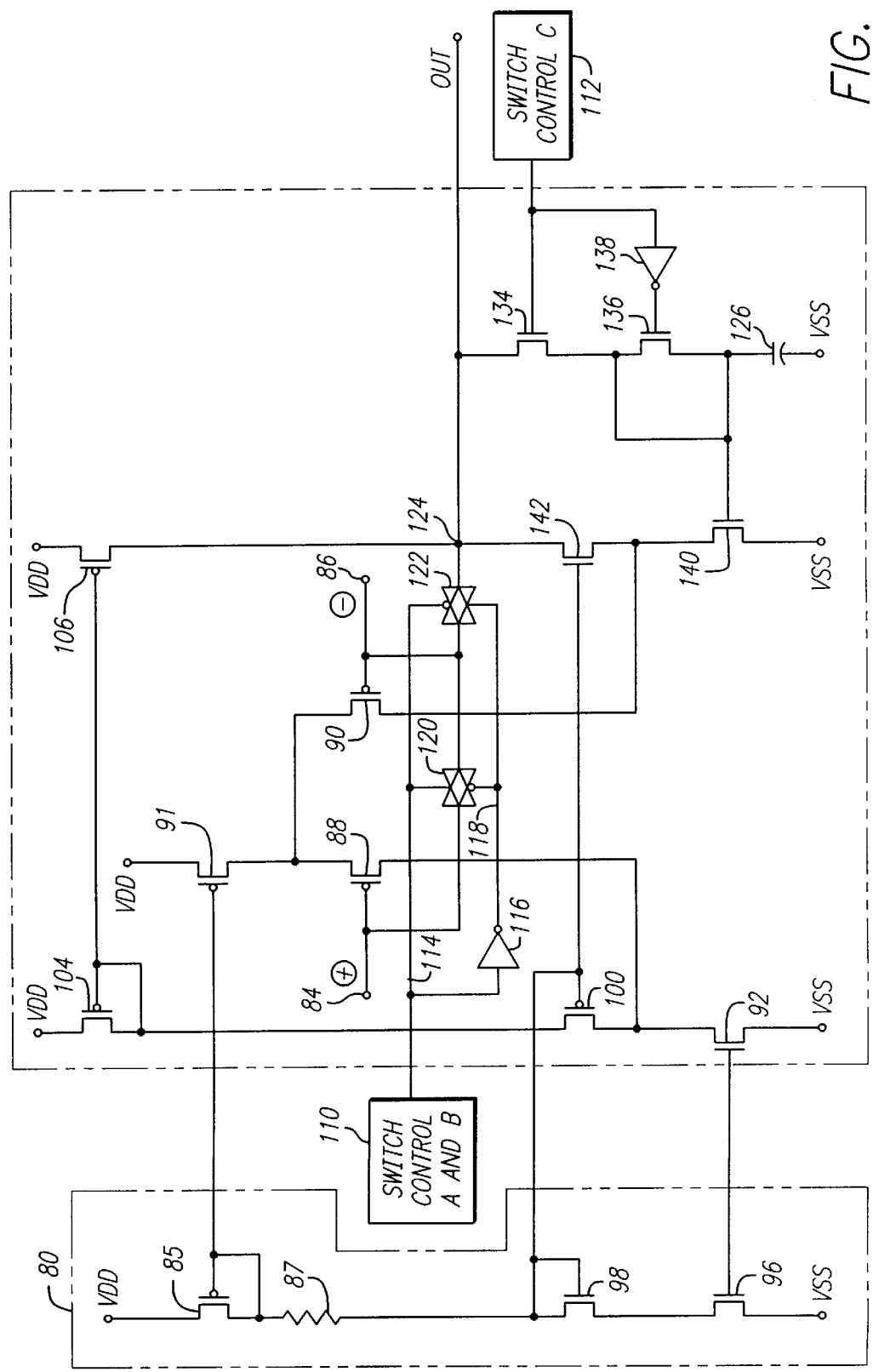
FIG. 6 is a circuit schematic similar to that of FIG. 5 but with a reduced transistor count achieved by combining together certain transistors.

FIG. 6 is a circuit schematic of an amplifier of the same general type shown in FIG. 5 but wherein the transistor count is reduced somewhat by combining certain devices within the amplifier and current copier sections of the circuit. Within FIG. 6, those devices that correspond to, and serve the same function as, similar devices already shown and described in FIG. 5 are identified by like reference numerals. In essence, transistors 94 and 130 of FIG. 5 are merged into single transistor 140 of FIG. 6, and transistors 102 and 132 of FIG. 5 are merged into single transistor 142 of FIG. 6. Apart from these differences, the circuitry of FIG. 6 functions in the same manner already described above in conjunction with FIG. 5.

FIG. 7 is a circuit schematic of a two-stage operational amplifier circuit wherein the current copier circuit of the present invention is inserted between the input and output stages. In FIG. 7, block 80 again designates a bias circuit wherein current source 144 represents a regulated current, and transistor 85 creates a bias voltage on conductor 146 for mirroring the regulated current within current source transistors 148, 150, and 152. In the preferred embodiment, current source transistor 148 of the input stage 154 is actually twice as large as transistor 85 for conducting twice the current therethrough. Within input stage 154, p-channel transistors 156 and 158 form a differential pair, and their gate terminals are coupled to the inverting and non-inverting input tenninals 157 and 159, respectively. Transistors 156 and 158 divide the current sourced by transistor 148, and the current steered by transistor 156 is copied into transistor 162. Ignoring any offset in input stage 154, and assuming that negative input terminals 157 and 159 are at the same voltage, then exactly one-half of the current sourced by transistor 148 is conducted by transistors 156 and 160, and exactly one-half of the current sourced by transistor 148 is also conducted by transistors 158 and 162.

The offset of the two-stage amplifier of FIG. 7 is dominated by the offset inherent in the input stage 154. To cancel this offset, current copier circuit 164 is coupled to output node 166 of input stage 154. Current copier circuit 164 contains essentially the same devices included in the current copier portion of the circuit shown in FIG. 6, and like devices have been designated by like reference numerals. When Switch A Control line 110 is pulled high, and Switch C Control line 112 is pulled high, the input terminals 157 and 159 are shorted by transmission gate 168, while node 170 of storage capacitor 126 is coupled to output node 166 to drive transistor 140 to sink the current sourced by transistor 150 plus or minus any net offset current from transistors 158 and 162. Subsequently, the Switch C control line 112 returns low to uncouple node 170 from node 166, and the Switch A Control line 110 thereafter returns low to disable transmission gate 168.

Output stage 172 of the two stage amplifier shown in FIG. 7 includes current mirror transistor 152 and n-channel transistor 174 coupled in series. The gate terminal of transistor 174 is the input terminal of output stage 172 and is coupled to the output node 166 of input stage 154.

Those skilled in the art will now appreciate that a simple and inexpensive differential amplifier circuit has been described which effectively cancels offset error within the differential amplifier using a relatively small number of transistors and components. The disclosed differential amplifier circuit allows both the differential input signal and the feedback path signal to be directly coupled to the input terminals of the differential amplifier without the use of AC coupling. Furthermore, the common mode level of the differential input signal can change after the offset error has been detected without requiring any resetting of the cancellation offset circuitry. In addition, the disclosed amplifier circuit effectively eliminates feedback loop settling time when detecting the offset error. The offset cancellation scheme disclosed above can be used with both single-stage differential amplifiers as well as multi-stage differential amplifiers without unduly complicating the differential amplifier or degrading its performance.

While the present invention has been described with respect to preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims.

We claim:

1. A differential amplifier circuit for driving a load and incorporating offset cancellation, said differential amplifier comprising in combination:

a. a differential amplifier having a positive input terminal and a negative input terminal for receiving an input differential voltage, said differential amplifier including an output terminal for producing an output current for driving the load, the output current being derived from the input differential voltage;

b. a first switch for selectively shorting together the positive input terminal and negative input terminal of said differential amplifier to null any input differential voltage thereacross;

c. a second switch for selectively coupling the output terminal of said differential amplifier to the negative input terminal of said differential amplifier for closed-loop operation, or selectively decoupling the output terminal of said differential amplifier from the negative input terminal of said differential amplifier for open-loop operation;

d. a current copier circuit, said current copier circuit having a first terminal for setting and maintaining a voltage, said current copier circuit also including a second terminal coupled to the output terminal of said differential amplifier for supplying an offset current having a magnitude based upon the voltage at the first terminal of said current copier circuit, said current copier circuit also including a storage for storing the voltage at the first terminal thereof;

e. a third switch for selectively coupling the first terminal of said current copier circuit to the output terminal of said differential amplifier; and f. a control circuit for selecting between a cancellation mode and an operating mode of said differential amplifier, said control circuit causing, during the cancellation mode, the first switch to be closed, the second switch to be opened, and the third switch to be closed, for allowing said current copier circuit to sense any output current offset at the output terminal of said differential amplifier with a null input differential voltage during open-loop operation, and to supply an equal and opposite offset current to the output terminal of said differential amplifier, said control circuit causing, during the operating mode, the first switch to be opened, the second switch to be closed, and the third switch to be opened, for allowing said differential amplifier to respond to the input differential voltage while continuing to supply the offset current to the output terminal of said differential amplifier to cancel any output current offset inherent in said differential amplifier.

2. The differential amplifier circuit recited by claim 1 wherein said control circuit opens the third switch before opening the first switch and before closing the second switch in order to decouple the first terminal of said current copier circuit from the output terminal of said differential amplifier before returning to the operating mode of said differential amplifier.

3. The differential amplifier circuit recited by claim 1 wherein said current copier circuit includes a storage capacitor coupled to the first terminal of said current copier circuit for sampling a voltage received thereby when said third switch is closed.

4. The differential amplifier circuit recited by claim 1 wherein said current copier circuit includes a current source coupled to the second terminal of said current copier circuit, said current source being controlled by the voltage sampled by said storage capacitor for supplying said offset current.

5. A method of canceling offset current inherent in a differential amplifier, the differential amplifier having a positive input terminal and a negative input terminal for receiving an input differential voltage, the differential amplifier including an output terminal for producing an output current for driving a load, the differential amplifier including a feedback path for coupling the output terminal thereof back to the negative input terminal thereof for closed loop operation, the output current being derived from the input differential voltage, the method comprising the steps of:

a. temporarily shorting together the positive input terminal and negative input terminal of the differential amplifier to null any input differential voltage thereacross;

b. temporarily opening the feedback path for decoupling the output terminal of the differential amplifier from the negative input terminal of the differential amplifier for open-loop operation;

c. sensing any offset current at the output terminal of the differential amplifier, and providing an equal and opposite offset cancellation current thereto;

d. terminating said sensing of the offset current, while recording the sensed offset current, and continuing to supply the recorded offset cancellation current to the output terminal of the differential amplifier to cancel any output current offset inherent in the differential amplifier.

e. discontinuing the shorting of the positive and negative input terminals of the differential amplifier for allowing the differential amplifier to again respond to the input differential voltage; and f. closing the feedback path for allowing the differential amplifier to operate in a closed loop manner once again.

6. The method recited by claim 5 wherein step d. is performed just before steps e. and f are performed.

\* \* \* \* \*